US012713562B2

(12) United States Patent
Grunow et al.

(10) Patent No.: US 12,713,562 B2

(45) Date of Patent: Aug. 18, 2026

(54) INFORMATION HANDLING SYSTEM THERMAL FIN TO REDUCE DUST FIBER ACCUMULATION

(71) Applicant: Dell Products L.P., Round Rock, TX (US)

(72) Inventors: David W. Grunow, Round Rock, TX (US); Qinghong He, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 236 days.

(21) Appl. No.: 18/611,943

(22) Filed: Mar. 21, 2024

(65) Prior Publication Data

US 2025/0301607 A1 Sep. 25, 2025

(51) Int. Cl.

*H05K 7/20* (2006.01)
*G06F 1/20* (2006.01)

(52) U.S. Cl.

CPC ........... *H05K 7/2039* (2013.01); *G06F 1/203* (2013.01)

(58) Field of Classification Search

CPC ...... F28F 3/02; F28F 3/025; F28F 3/00; F28F 3/08; F28F 2215/10; F28F 2215/00; F28F 2215/04; H01L 23/3672; H05K 7/2039; H05K 7/20409; G06F 1/203

See application file for complete search history.

(56) References Cited

U.S. PATENT DOCUMENTS 7,345,874 B2 3/2008 Cheng et al.
7,643,295 B2 1/2010 Chao et al.
7,861,768 B1 1/2011 Ghantiwala
8,256,495 B2 * 9/2012 Hattori .................... G06F 1/203 165/200
8,699,226 B2 * 4/2014 Tanner .................. G06F 1/1656 361/679.48
11,913,737 B2 2/2024 Poltorak
2004/0012983 A1 * 1/2004 Fearing .................. H05K 7/209 363/16
2007/0215318 A1 * 9/2007 Chiang ............... H01L 23/3672 165/185
2008/0112134 A1 * 5/2008 Rubenstein ........... H01L 23/467 257/E23.099
2008/0121374 A1 5/2008 Wang et al.
2012/0279696 A1 * 11/2012 Hsu ........................... F28F 7/00 165/185
2020/0159296 A1 * 5/2020 Zhu .................... H05K 7/20145

* cited by examiner

*Primary Examiner* — Jayprakash N Gandhi
*Assistant Examiner* — Matthew Sinclair Muir
(74) *Attorney, Agent, or Firm* — Zagorin Cave LLP; Robert W. Holland

(57) ABSTRACT

An information handling system rejects thermal energy through a heat pipe coupled to a thermal fin that fits in a housing exhaust and has cooling airflow drawing across fin elements. The thermal fin has full-height fin elements that fit in the full opening size of the exhaust and reduced-height fin elements that leave a gap at the opening with a larger air channel to prevent dust accumulation. The thermal fin is assembled from plural clips of bent sheet metal to have one full-height fin element, one reduced-height fin element and a table and slot arrangement to support assembly.

18 Claims, 8 Drawing Sheets

INFORMATION HANDLING SYSTEM THERMAL FIN TO REDUCE DUST FIBER ACCUMULATION

BACKGROUND OF THE INVENTION

Field of the Invention

The present invention relates in general to the field of information handling system thermal management, and more particularly to an information handling system thermal fin to reduce dust fiber accumulation.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Portable information handling systems integrate processing components, a display and a power source in a portable housing to support mobile operations. Portable information handling systems allow end users to carry a system between meetings, during travel, and between home and office locations so that an end user has access to processing capabilities while mobile. Tablet configurations typically expose a touchscreen display on a planar housing that both outputs information as visual images and accepts inputs as touches. Convertible configurations typically include multiple separate housing portions that couple to each other so that the system converts between closed and open positions. For example, a main housing portion integrates processing components and a keyboard and rotationally couples with hinges to a lid housing portion that integrates a display. In a clamshell configuration, the lid housing portion rotates approximately ninety degrees to a raised position above the main housing portion so that an end user can type inputs while viewing the display. After usage, convertible information handling systems rotate the lid housing portion over the main housing portion to protect the keyboard and display, thus reducing the system footprint for improved storage and mobility.

One difficulty with portable information handling systems is that the processing components in the portable housing tend to generate thermal energy as power dissipates during processing operations. In low profile housings, excess thermal energy can be difficult to reject to the environment due to the minimal volume in the housing for airflow. Typically, a cooling fan is included in the portable housing to draw in external air past thermal exchange devices and exhaust the air to the external environment. To encourage thermal exchange, heat-producing components, such as the CPU and GPU, typically have heat sinks that accept excess thermal energy. The heat sinks in turn are typically thermally coupled by a heat pipe to thermal fins that extend into the cooling airflow pathway. The advantage of thermal fins is that they expose a relatively large surface area to the cooling airflow so that thermal energy is more efficiently rejected. Often, the thermal fins couple to the heat sink through a heat pipe so that the thermal fins are placed at the housing cooling airflow exhaust.

Portable handling systems are used in a wide range of conditions. In very dusty conditions that include fibers, the dust and fibers can accumulate at the thermal fins, increasing impedance of airflow out the exhaust. When too much dust accumulates, restricted airflow results in excessive thermal operating conditions so that processing components are throttled to produce less thermal energy by operating at lower speeds. In one example embodiment, dust accumulation restricted airflow to reduce thermal exchange so that the CPU had to reduce power dissipation by 40%. Reduced ability to reject excess thermal energy translates to slow processing speeds that directly impact the end user experience. One solution is to space thermal fins further apart from each other so that dust does not accumulate, however, increasing the space between thermal fins reduces the surface area exposed to the cooling airflow. For example, a 2.0 mm thermal fin spacing as opposed to a 1.0 mm thermal fin spacing substantially drops thermal rejection efficiency when no dust is present. In one example embodiment, a 1.0 mm thermal fin spacing allowed a 21.9 W CPU to operate at full power while a 2.0 mm thermal fin spacing supported only 18.1 W for a 17% power reduction.

SUMMARY OF THE INVENTION

Therefore, a need has arisen for a system and method which enhances thermal rejection by thermal fins with reduced dust fiber accumulation.

In accordance with the present invention, a system and method are provided which substantially reduce the disadvantages and problems associated with previous methods and systems for rejecting excess thermal energy from an information handling system. A thermal fin coupled at a housing exhaust having a height includes full-height fin elements and reduced height fin elements to define full size air channels and reduced size air channels. When dust accumulates at the reduced size air channels to block airflow, the full size air channels pass air that is then able to transfer thermal energy with the reduced height fin elements within the thermal fin past the blockage.

More specifically, a portable information handling system built in a portable housing processes information with processing components, such as a processor and memory, that generate thermal energy as a byproduct of power dissipation. A cooling fan in the housing generates a cooling airflow to aid in rejection of the excess thermal energy. The cooling airflow passes through a thermal fin that thermally couples to a processing component, such as the processor. The thermal fin has variable height fin elements to define different sized air channels that accept the cooling airflow from the cooling fan. When a reduced size air channel becomes blocked due to dust fibers, a full size air channel adjacent to the reduced size air channel passes air through to the fin elements so that the full surface area of the fin elements is available for thermal transfer.

The present invention provides a number of important technical advantages. One example of an important technical advantage is that a thermal fin provides enhanced thermal transfer with fin elements having narrow spacing while preserving the ability to efficiently transfer thermal energy when the narrow spacing becomes blocked due to dust accumulation. Air channels with increased fin element spacing prevents full blockage at the thermal fin while directing airflow past the blockage and along the narrow passageways for efficient thermal transfer even in blocked situations.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

An information handling system thermal includes full-height fin elements adjacent reduced-height fin elements to create air channels that help to prevent dust fiber blockages to cooling airflow. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
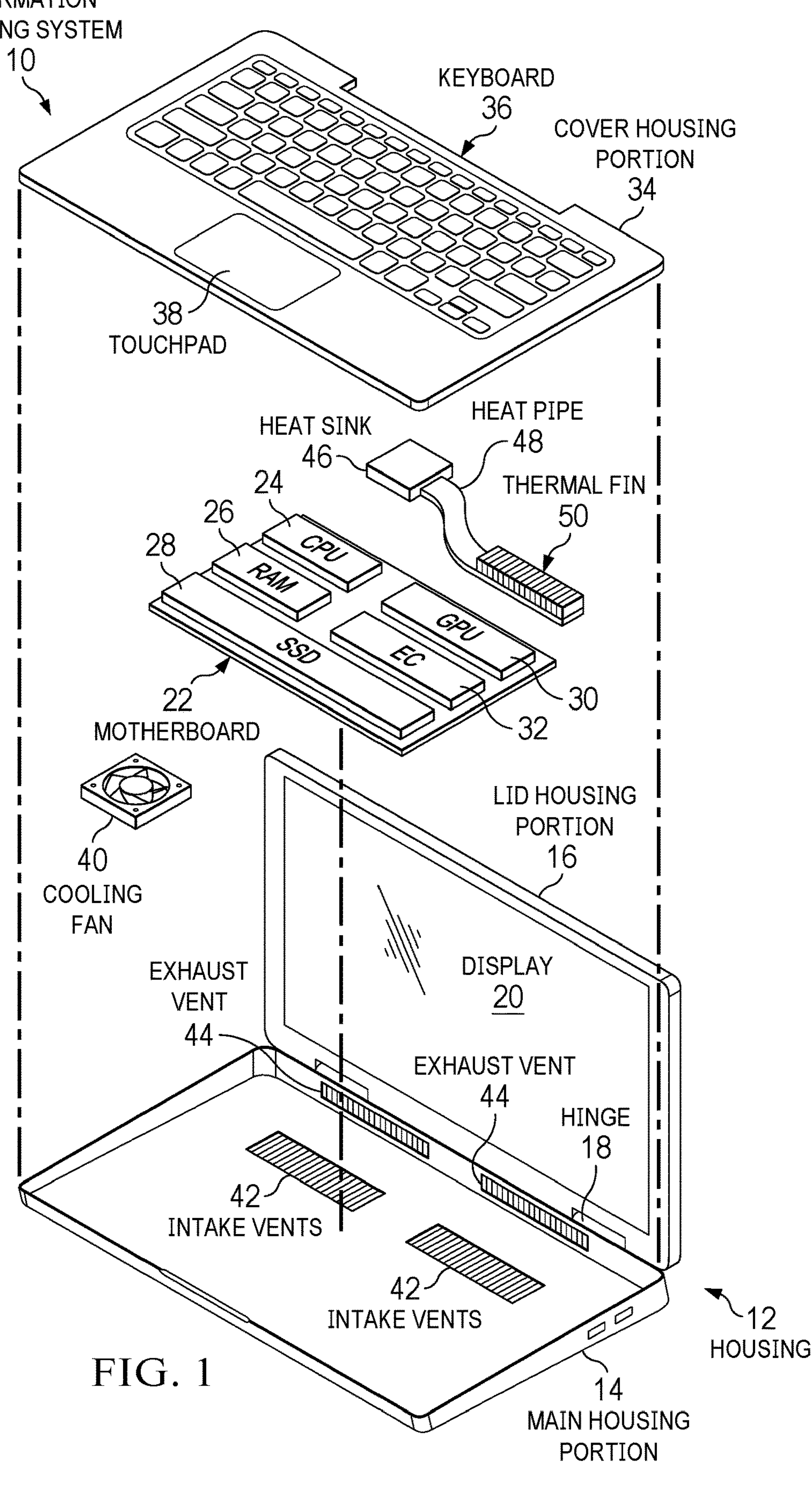
FIG. 1 depicts an exploded perspective view of a portable information handling system having a thermal fin with variable height fin elements that resist dust fiber accumulation.

Referring now to FIG. 1, an exploded perspective view depicts a portable information handling system 10 having a thermal fin 50 with variable height fin elements that resist dust fiber accumulation. Portable information handling system 10 has a housing 12 with a convertible configuration having a main portion 14 rotationally coupled to a lid portion 16 by a hinge 18. A display 20 integrates in lid portion 16 to present information as visual images. A motherboard 22 couples in main portion 14 to interface processing components that cooperate to process information. A central processing unit (CPU) 24 executes instructions to process information in cooperation with a random access memory (RAM) 26 that stores the instructions and information. A solid state drive (SSD) 28 provides persistent storage of information and instructions that are retrieved to RAM 26 for execution, such as an operating system and applications. A graphics processing unit (GPU) 30 further processes information to define visual images for presentation at display 20. An embedded controller 32 manages physical conditions within housing 12, such as application of power and thermal conditions, as well as interactions with input/output (I/O) devices. A cover housing portion 34 couples over main portion 14 to protect the processing components and support a keyboard 36 and touchpad 38 that accept end user inputs.

During operation, dissipation of power through the processing components generates thermal energy as a byproduct that increases temperatures within housing 12. To manage thermal conditions, embedded controller 32 operates a cooling fan 40 to generate a cooling airflow that rejects excess thermal energy to external housing 12. For example, air is pulled by cooling fan 40 through intake vents 42 and exhausted out exhaust vents 44 at a rear side of housing 12. To enhance the exchange of thermal energy to the cooling airflow, a heat sink 46 couples to heat generating components, such as CPU 24, and transfers energy through a heat pipe 48 to a thermal fin 50 that couples at exhaust vents 44. Thermal fin 50 includes plural thermal fin elements that are exposed in the cooling airflow to increase the surface area available for transfer of thermal energy. Embedded controller 32 manages cooling fan airspeed to maintain operating temperatures within a defined operating range. When cooling fan 40 operates at full speed and thermal conditions exceed the operating range, embedded controller 32 will throttle the processing components to operate at slower speeds so that less thermal energy is generated by power dissipation. Cooling fan 40 has to operate at higher speeds when cooling airflow impedance is high, such as when thermal fin 50 is blocked by dust fibers that accumulate at the thermal fin intake. Excessive buildup of dust fibers can result in high fan speeds, which increases power use and system noise and which can result in throttling of CPU operations for slow system response.

Figure 2:
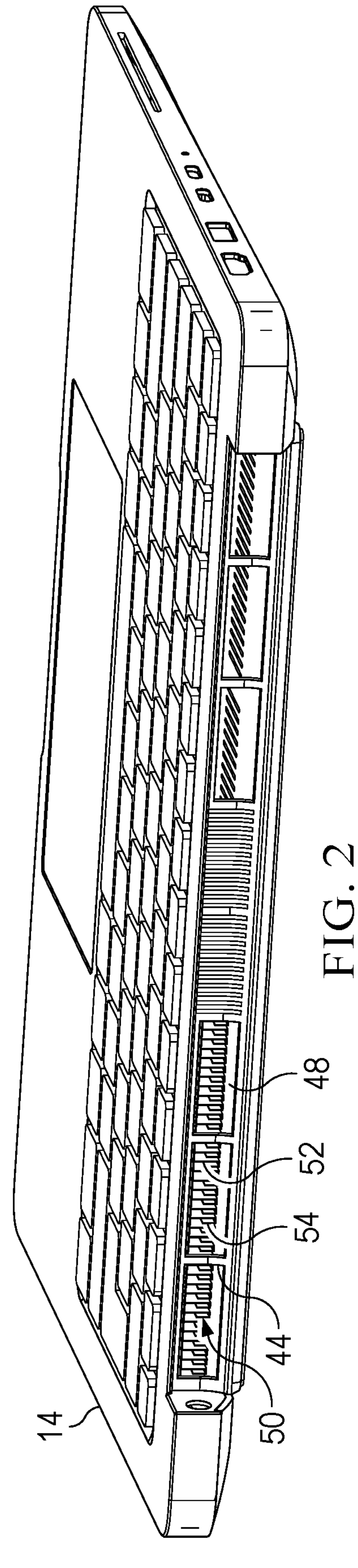
FIGS. 2 and 2A depict a rear perspective view of a housing main portion with exhaust vents having full-height fin elements and reduced-height fin elements to reduce dust fiber build up.
Figure 2A:
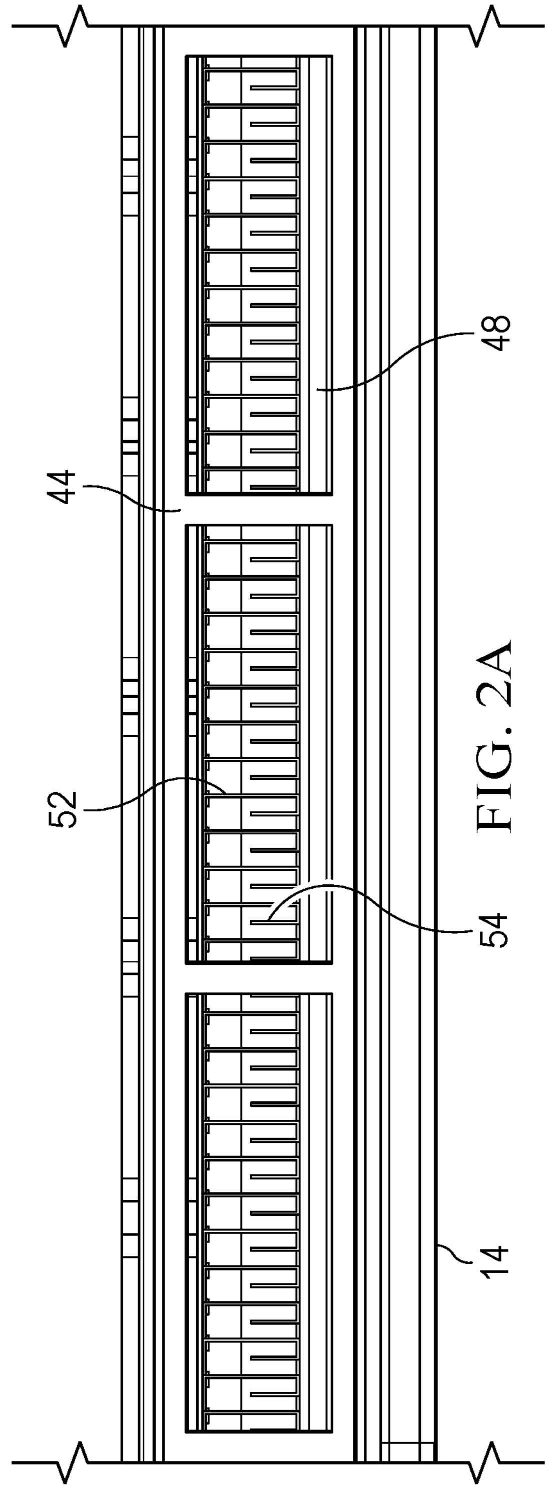

Referring now to FIGS. 2 and 2A, a rear perspective view depicts housing main portion 14 with exhaust vents 44 having full-height fin elements 52 and reduced-height fin elements 54 to reduce dust fiber build up. In most situations, exhaust vent 44 is at a rear side of housing main portion 14 to minimize end user touches at areas heated by thermal exchange from thermal fin 50. Dust blockages in this scenario are internal to the housing and thus not accessible to an end user. To prevent dust blockages while having sufficient thermal fin surface area for thermal exchange, a set of full height fin elements 52 and a set of reduced height fin elements 54 are included in thermal fin 50. Full-height fin elements 52 couple to heat pipe 48 at a bottom end and extend up into exhaust vent 44 to an upper side so that the airflow through the full height of exhaust vent 44 is exposed to surface area of full-height fin element 52. Reduced height fin elements 54 couple to heat pipe 48 and extend up only partially into the area of exhaust vent 44 so that an empty space is left between the end of reduced-height fin element 54 and the upper side of exhaust vent 44. The empty space is of a size sufficient to prevent a build up of dust that blocks airflow. FIG. 2A depicts an example embodiment where the full sized fin elements 52 and reduced size fin elements 54 are interleaved in an alternating pattern across the length of thermal fin 50. In alternative embodiments, other patterns may be used, such as having a reduced height fin element every second or third full height fin element. In the example embodiment, reduced-height fin elements 54 couple to heat pipe 48 with the empty space distal heat pipe 48 to help transfer thermal energy more efficiently, although an alternative embodiment may have reduced height fin elements extended down from an upper support so that the empty space is located near heat pipe 48.

Figure 3:
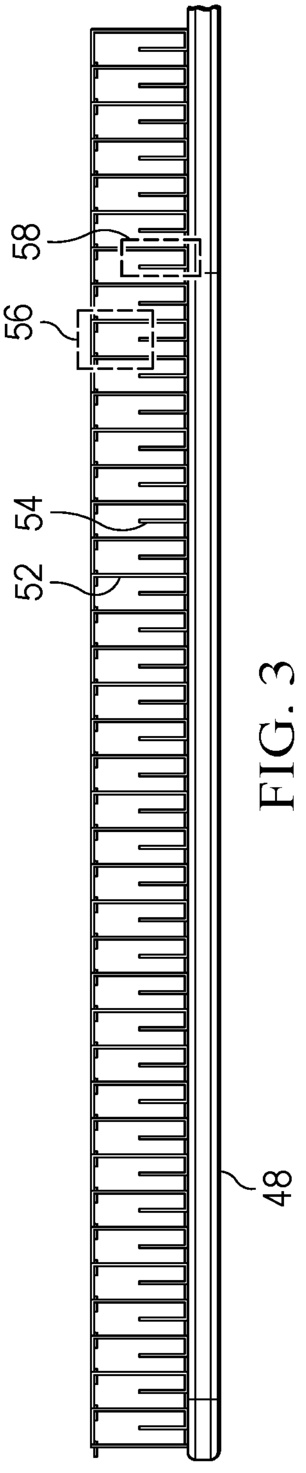
FIG. 3 depicts a side view of the thermal fin from an interior of the housing.

Referring now to FIG. 3, a side view depicts the thermal fin 50 from an interior of the housing. In the example embodiment, thermal fin 50 is shaped steel or aluminum that solders to heat pipe 48. Each fin element has a thickness of 0.2 mm and each full-height fin element is spaced 2.0 mm from the adjacent full-height fin element 52 for a 2.2 mm pitch. A reduced-height fin element 54 couples between each pair of full-height fin elements 52 for a 0.9 mm spacing with a 1.1 mm pitch. The arrangement of full-height and reduced height fin elements defines two sizes of air channels through which cooling airflow passes. A full-size air channel 56 has a 2.0 mm by 2.0 mm opening area. A reduced size air channel 58 has a 0.9 mm by 2.0 mm opening area. Although the reduced size air channel offers better surface area for thermal exchange, the smaller area is susceptible to dust buildup and blockage under some conditions. The full size air channel ensures airflow when the smaller area does get blocked.

Figure 4:
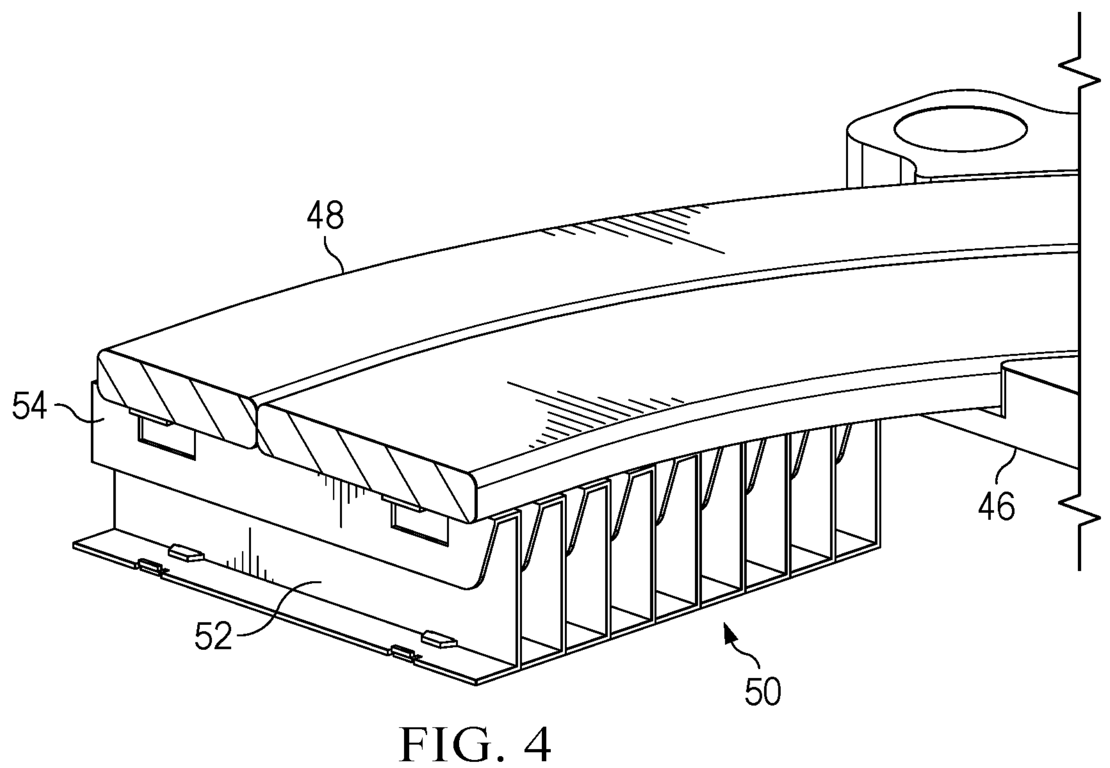
FIG. 4 depicts a side perspective lower view of an example assembly of thermal fin clips into a thermal fin.

Referring now to FIG. 4, a side perspective lower view depicts an example assembly of thermal fin clips into a thermal fin. Heat sink 46 couples to heat pipe 48 to transfer thermal energy to thermal fin 50, such as with a vapor chamber defined in heat pipe 48. Thermal fin 50 is assembled from plural clips that each include one full-height fin element 52 and one reduced size fin element 54. Each clip couples to adjacent clips to support variable lengths of the thermal fin. The base of the clips are soldered to heat pipe 48 so that the thermal fin assembly is secured in place for a robust assembly.

Figure 5:
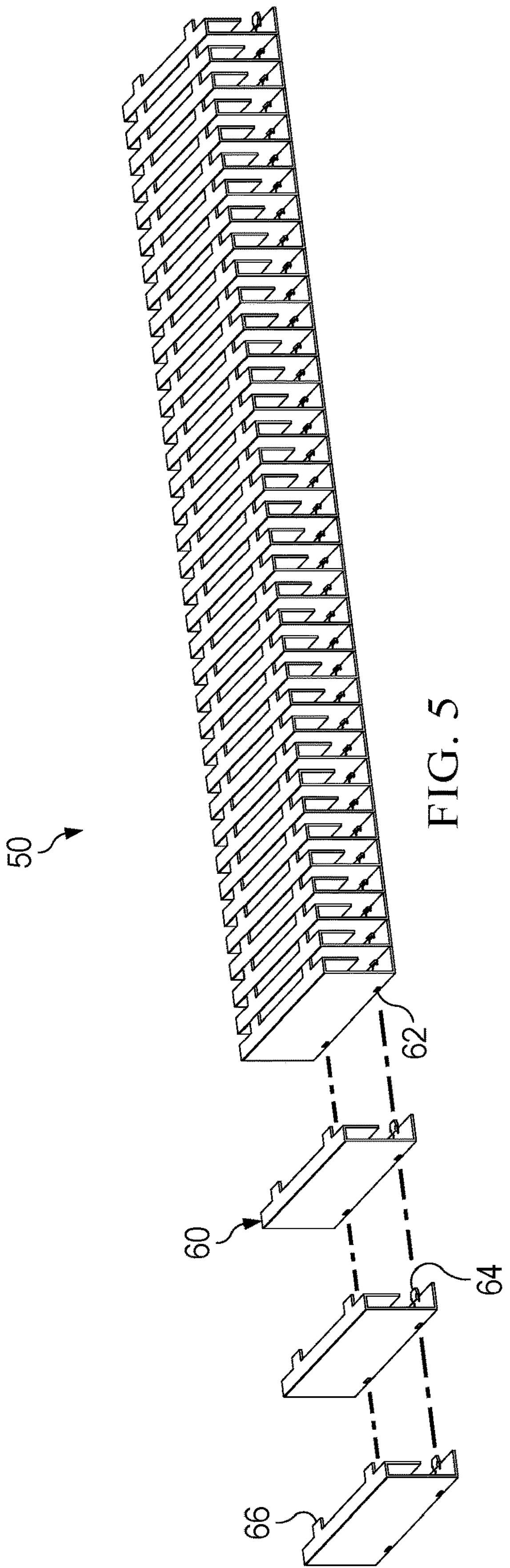
FIG. 5 depicts a side perspective exploded view depicting assembly of clips 60 to form a thermal fin.

Referring now to FIG. 5, a side perspective exploded view depicts assembly of clips 60 to form a thermal fin 50. Each clip 60 has a tab 64 that extends into a slot 62 of an adjacent clip to position the clips in alignment. A pair of tabs 66 at the bottom side of thermal fin 50 spaces the clips apart and provides a surface to solder to the heat pipe. In various embodiments, slot 62 may include a structure to grasp an inserted tab to maintain the structure stable until the heat pipe is soldered into place.

Figure 6:
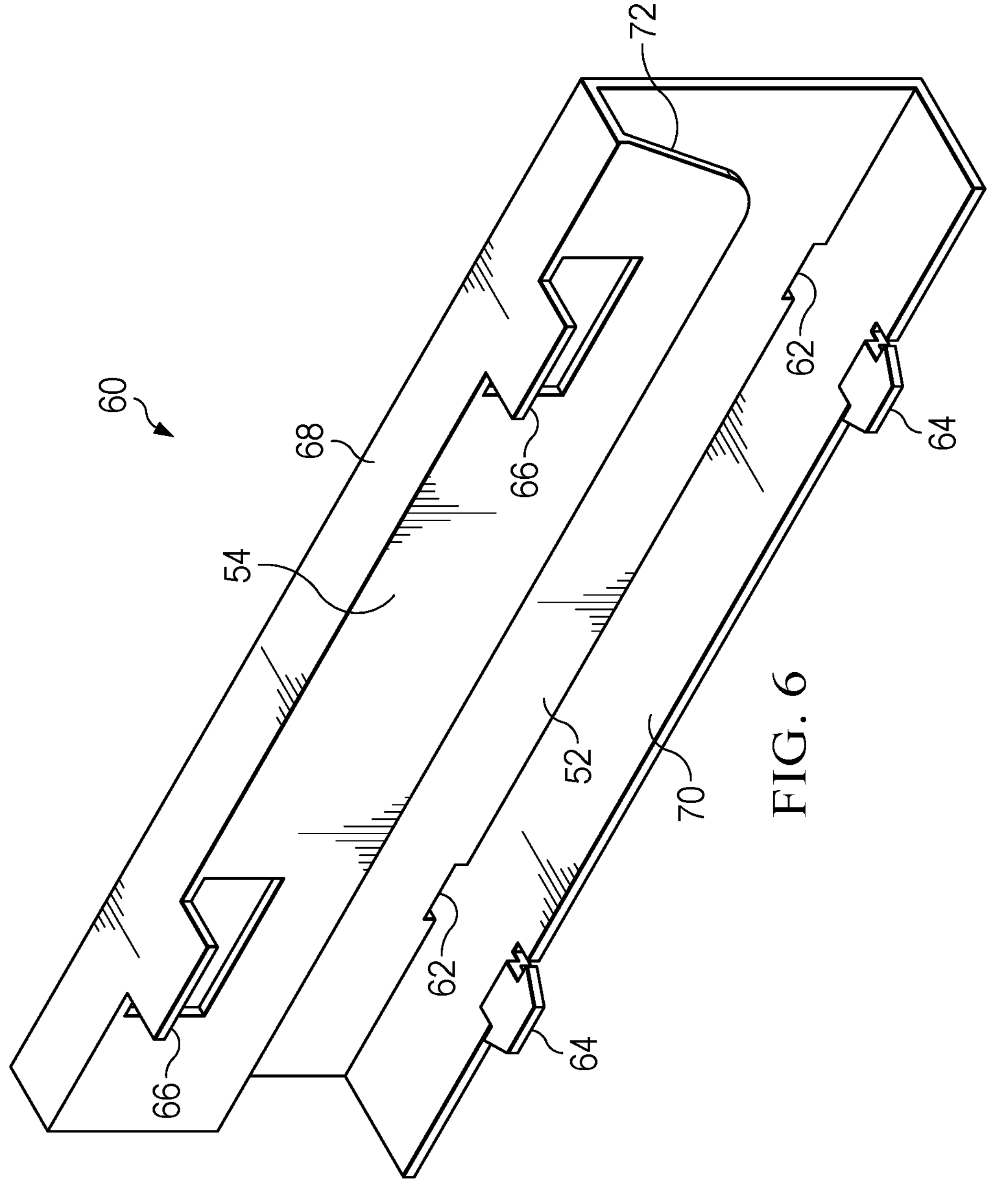
FIG. 6 depicts a side perspective view of a clip fabricated to assemble into a thermal fin.

Referring now to FIG. 6, a side perspective view depicts a clip 60 fabricated to assemble into a thermal fin. In the example embodiment, clip 60 is bent from a sheet of metal, such as steel, to have a top support surface 70 and a bottom support surface 68 that holds full-height fin element 52 and reduced height fin element 54 in place. Tabs 66 are punched parallel to bottom support surface 68 to hold the space adjacent clips apart. Tabs 64 are punched to insert in adjacent slots 62 to couple the clips together. A front curved section 72 on reduced height fin element 54 guides dust fibers to pass through the thermal fin. In one embodiment, front curved section 72 has a sharpened edge to help cut dust fibers into smaller pieces. The sharpened edge may be serrated or otherwise formed to help create a cutting motion from the force of cooling airflow pushing into clip 60.

Figure 7:
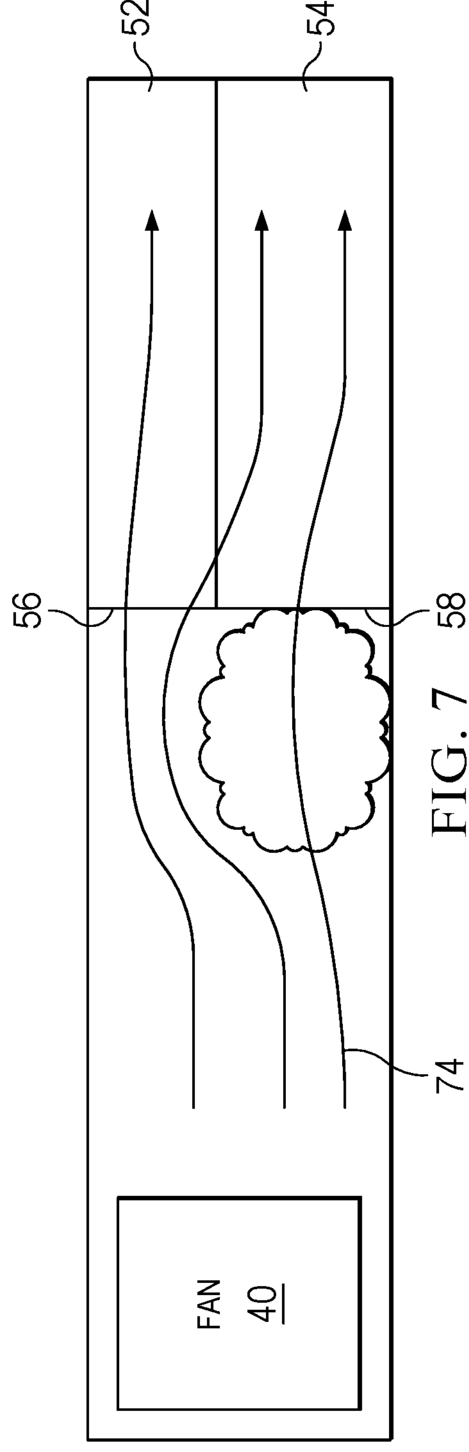
FIG. 7 depicts airflow into a thermal fin with dust blockage at a reduced height fin element.

Referring now to FIG. 7, airflow 74 is depicted into a thermal fin with dust blockage at a reduced height fin element 54. Fan 40 generates airflow 74 to pass across full-height fin elements 52 and reduced height fin elements 54. In the full area channel 56, a cross section is sufficient to pass airflow without accumulating dust fibers that can block airflow. In the reduced size channel 58 the smaller cross section can result in dust accumulation that blocks airflow. When this occurs, air is forced through full size channel 56 and then can drop into the smaller channel so that the surface area of the reduced height fin elements is available to transfer thermal energy. This arrangement improves thermal exchange in a balanced manner when dust is not present to cause a blockage and when dust does cause a blockage. For example, the variable height fin elements provide 95% of the available power at a system compared to a thermal fin having 1 mm spacing of thermal fin elements for the full height. When dust accumulates, the variable height fin elements provide 83% of the available power at a system, substantially the same power available from a thermal fin having 2 mm spacing for only full height fin elements. The amount of cooling provided for a particular system may be adjusted with different fin element spacings, heights and other factors, such as based upon cooling fan airflow strength and expected environment factors.

Although the present invention has been described in detail, it should be understood that various changes, substitutions and alterations can be made hereto without departing from the spirit and scope of the invention as defined by the appended claims.

What is claimed is:

1. An information handling system comprising:

a housing having an exhaust, the exhaust having a height and a length;

a processor coupled in the housing and operable to execute instructions that process information;

a memory coupled in the housing and interfaced with the processor, the memory operable to store the instructions and information; and a thermal fin coupled at the exhaust and thermally coupled to the processor, the thermal fin having plural fin elements including a first set of fin elements having the height, a second set of the fin elements interspersed between the first set and having less than the height to define a first set of channels of a first width between fin elements of the first set and second set and a second set of channels of a second width between fin elements of the first set;

wherein each the of the second set of fin elements has a sharpened edge exposed at the housing exhaust exterior to cut dust fibers.

2. The information handling system of claim 1 wherein:

the first and second set of thermal fin elements have a thickness of 0.2 mm;

each of the second set of channels has a square shape with an 8 mm perimeter; and each of the first set of channels has a rectangle shape with 0.9 mm spacing.

3. The information handling system of claim 1 wherein the second set of fin elements are one-half the height of the first set of fin elements.

4. The information handling system of claim 1 wherein the first set of fin elements and second set of fin elements couple to alternate along the length of the exhaust.

5. The information handling system of claim 4 further comprising a heat pipe thermally coupling the processor to the thermal fin, each of the first set of fin elements and second set of fin elements extending down from the heat pipe into the exhaust.

6. The information handling system of claim 1 wherein the thermal fin comprises plural assembled clips that couple together, each clip having one of the first set of fin elements and one of the second set of fin elements.

7. The information handling system of claim 6 wherein each assembled clip comprises sheet metal bent to form the one of the first set of fin elements and one of the second set of fin elements aligned with the exhaust height separated by a support aligned with the exhaust length.

8. The information handling system of claim 7 wherein the one of the first set of fin elements has a slot aligned to accept a tab extending from the sheet metal of a different of the first set of fin elements.

9. A method for cooling an information handling system having an exhaust of a height and length, the method comprising:

forming a thermal fin to have plural full-height fin elements having a height of the exhaust height, and plural reduced-height fin elements having a height of less than the exhaust height;

sharpening an edge of each reduced-height fin to cut dust fibers blown against the sharpened edge;

thermally-coupling the thermal fin with a processor of the information handling system; and blowing cooling airflow across the thermal fin to transfer thermal energy from the processor and out the exhaust.

10. The method of claim 9 further comprising:

arranging the full-height fin elements and the reduced-height fin elements to have an order of every other fin element; and defining by the every other fin element order a first set of channels having a first perimeter and a second set of channels having a second perimeter.

11. The method of claim 10 wherein:

each of the first set of channels has a perimeter defined only by full-height fin elements; and each of the second set of channels has a perimeter defined by both a full-height fin element and a reduced-height fin element.

12. The method of claim 11 wherein the perimeter of the full-height fin element channel is 8 mm.

13. The method of claim 10 further comprising:

forming plural clips by bending sheet metal, each clip having one full-height fin element and one reduced-height fin element;

forming a tab and a slot in each of the plural clips; and assembling the thermal fin from the plural clips by inserting the tab in the slot.

14. The method of claim 13 further comprising:

soldering the thermal fin to a heat pipe; and thermally coupling the heat pipe to the processor of the information handling system.

15. The method of claim 14 further comprising arranging the thermal fin to have all of the reduced-height fin elements proximate the heat pipe and the first set of channels defined by the full-height fin elements distal the heat pipe.

16. A thermal fin comprising:

plural full-height fin elements sized to fully fit in a housing exhaust height; and plural reduced-height fin elements sized to have less than the housing exhaust height, each of the reduced-height fin elements disposed between full-height fin elements;

wherein the reduced-height fin elements comprise a sharp curved edge aligned to cut dust fibers blown against the reduced-height fin elements.

17. The thermal fin of claim 16 further comprising a heat pipe coupled to the full-height fin elements and to the reduced-height fin elements.

18. The thermal fin of claim 16 further comprising plural clips, each of the plural clips having one full-height fin element, one reduced-height fin element, a tab and a slot, the tab and slot interlocking to assembled as the thermal fin.

* * * * *